United States Patent [19]

Carusillo

[11] Patent Number: 4,558,274
[45] Date of Patent: Dec. 10, 1985

[54] APPARATUS AND METHOD DETERMINING THE VALUE OF A CAPACITANCE

[75] Inventor: Steven J. Carusillo, Elkhart, Ind.

[73] Assignee: Johnson Service Company, Milwaukee, Wis.

[21] Appl. No.: 532,017

[22] Filed: Sep. 14, 1983

[51] Int. Cl.[4] .................. G01R 11/52; G01R 27/26
[52] U.S. Cl. .................................................. 324/60 CD
[58] Field of Search .................... 324/60 CD, 60 C; 340/870.37; 73/718, 724

[56] References Cited

U.S. PATENT DOCUMENTS

| 3,824,459 | 7/1974 | Uchida | 324/60 CD |
| 4,065,715 | 12/1977 | Jaffe et al. | 324/60 CD |
| 4,227,419 | 10/1980 | Park | 73/724 |
| 4,492,916 | 1/1985 | Johnson | 324/60 CD |

FOREIGN PATENT DOCUMENTS 1384585 2/1975 United Kingdom .......... 324/60 CD

Primary Examiner—Stanley T. Krawczewicz
Attorney, Agent, or Firm—Larry L. Shupe; Joseph J. Jochman, Jr.; John P. Ryan

[57] ABSTRACT

An apparatus useful in determining the value of a capacitor includes a first bilateral switch for flowing a charging current through a resistive element to an initially-depleted first capacitor of known value. The first capacitor is thereby charged to the potential of a trigger reference over a resulting first time period. A second bilateral switch is provided for flowing a charging current through the same resistive element to an initially-depleted second capacitor, thereby charging it to the potential of the same trigger reference over a resulting second time period. A device such as an oscilloscope or frequency counter is used for determining these time periods and the value of the unknown second capacitor may thereupon be computed using disclosed formulas.

A method for determining the value of a capacitor includes the steps of flowing a charging current through a resistive element to an initially-depleted first capacitor of known value, thereby charging this capacitor to the potential of a trigger reference over a resulting first time period. A charging current is then caused to flow through the same resistive element to an initially-depleted second capacitor for charging it to the potential of the trigger reference over a resulting second time period. The value of the second capacitor is then computed by utilizing the first time period, the second time period and the value of the first capacitor.

14 Claims, 11 Drawing Figures

APPARATUS AND METHOD DETERMINING THE VALUE OF A CAPACITANCE

This invention relates generally to the art of electrical measurement and more specifically to an apparatus and method having reduced sensitivity to changes in ambient temperature and useful for determining by time sequencing, the value of an unknown capacitance.

BACKGROUND OF THE INVENTION

In the electrical arts, it is frequently desirable to determine the value of an unknown capacitor. Several approaches are known for making such a determination as, for example, that disclosed in U.S. Pat. No. 3,824,459 which describes an apparatus for finding the value of a capacitance by generating counted pulses representative thereof. The number of these generated pulses is dependent upon the accuracy of the determined values of a pair of resistors. Yet another example is shown in U.S. Pat. No. 4,065,715 which describes a circuit for simultaneously charging a reference capacitor of known value and a second capacitor of unknown value. Each capacitor is connected in parallel with its own resistor and the voltage across each capacitor is directed to a separate threshold detector. The value of the unknown capacitance is determinable by measuring the difference in time between that required to trigger the first detector and that required to trigger the second detector.

Yet another type of capacitance transducer is shown in U.S. Pat. No. 4,227,419. The circuit disclosed therein uses a common current source to charge either of two capacitors and provides an output pulse train having positive and negative portions, the durations of which are compared for determining the value of a varying capacitance with respect to a known, fixed capacitance. The apparatus uses two comparator-detector circuits for triggering a flip-flop circuit. Another circuit for measuring capacitance is shown and described in a bulletin titled "Capacitive Humidity Sensor, Technical Information 063", believed to have been published by U.S. Philips Corp. The circuit disclosed therein uses a free running multivibrator with a second multivibrator slaved thereto. These timing circuits generate pulses useful for capacitance determination. Each multivibrator uses a separate but nominally equal trigger voltage level and has a characteristic cyclic period which is dependent upon the value of a resistor dedicated to a particular multivibrator.

While these known devices and methods have heretofore been generally satisfactory, they tend to be characterized by certain disadvantages. In particular, they variously employ separate comparator circuits for triggering purposes, separate trigger voltage reference sources and/or separate resistive elements for capacitance determination. It is known to those in the electrical arts that certain characteristics of the surrounding ambient, most notably temperature, may affect the values of these components with a resultant loss in measurement accuracy. An apparatus and method useful in making capacitance measurements which employs a single, common resistive element for capacitor charging and a single voltage reference for generating a trigger or clocking pulse would be a significant advance in the art. The inventive apparatus and method are seen as being particularly useful in heating, ventilating and air conditioning (HVAC) applications where the value of the measured capacitance is representative of relative humidity, pressure, temperature or other parameter.

It is an object of the invention to provide an apparatus and method for capacitance measurement which overcomes the disadvantages of the prior art.

Another object of the present invention is to provide a capacitance measuring apparatus which utilizes a single, common resistive element for capacitor charging.

Yet another object of the invention is to provide an apparatus and method for capacitance measurement which utilizes a single, common trigger reference for generating clocking pulses useful in making such measurements.

Still another object of the present invention is to provide an apparatus and method for determining the value of a capacitor wherein the effect of changes in ambient temperature is reduced.

Another object of the present invention is to provide an apparatus and method for capacitance measurement which makes advantageous use of integrated circuitry. These and other objects of the invention will become more apparent from the detailed description thereof taken in conjunction with the accompaning drawing.

SUMMARY OF THE INVENTION

In general, an apparatus useful in determining the value of a capacitor includes a first bilateral switch for flowing a charging current through a resistive element to an initially-depleted first capacitor of known value. The first capacitor is thereby charged to the potential of a trigger reference over a resulting first time period. A second bilateral switch is provided for flowing a charging current through the same resistive element to an initially-depleted second capacitor, thereby charging it to the potential of the same trigger reference over a resulting second time period. A device such as an oscilloscope or frequency counter is used for determining these time periods and the value of the unknown second capacitor may thereupon be computed using disclosed formulas.

A method for determining the value of a capacitor includes the steps of flowing a charging current through a resistive element to an initially-depleted first capacitor of known value, thereby charging this capacitor to the potential of a trigger reference over a resulting first time period. A charging current is then caused to flow through the same resistive element to an initially-depleted second capacitor for charging it to the potential of the trigger reference over a resulting second time period. The value of the second capacitor is then computed by utilizing the first time period, the second time period and the value of the first capacitor.

DETAILED DESCRIPTION OF THE PREFERRED EMBODIMENT

Figure 1:
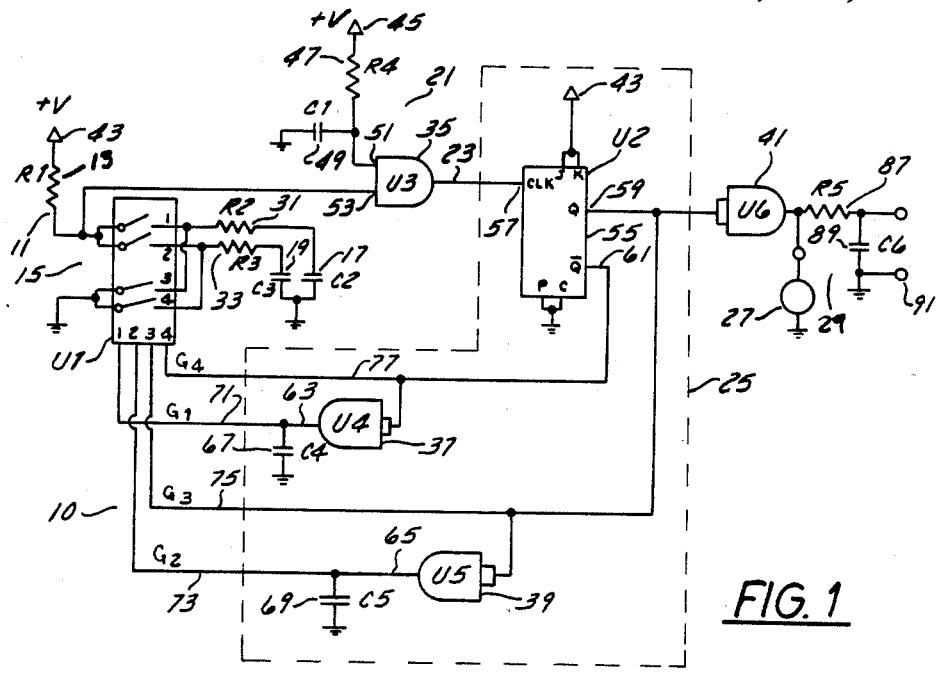
FIG. 1 is a simplified schematic circuit diagram of the apparatus of the present invention.
Figure 4:
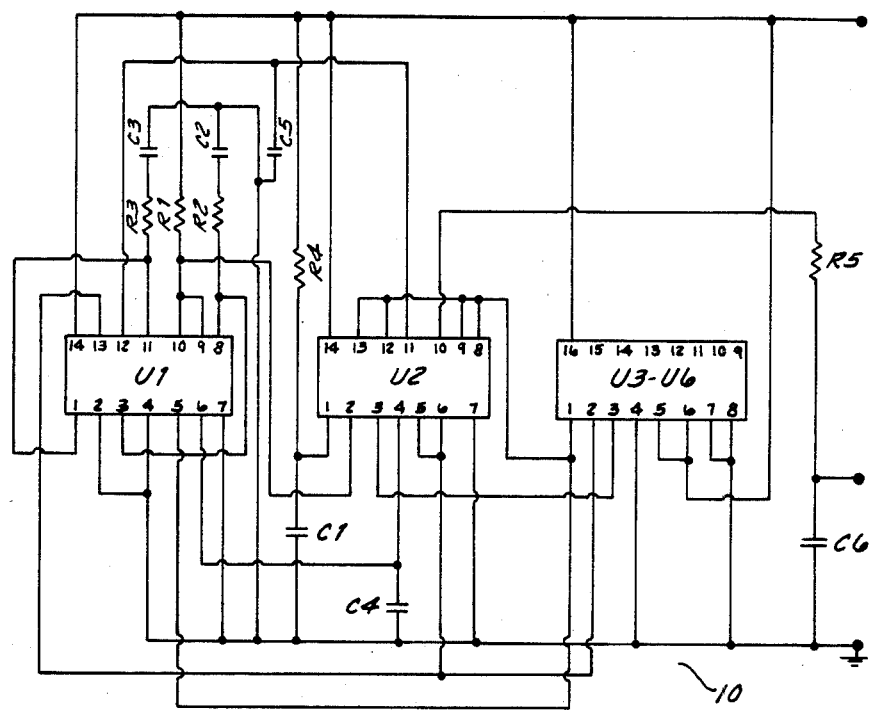
FIG. 4 represents a preferred embodiment of the inventive circuit using integrated circuit technology.

Referring first to FIG. 1, the inventive circuit apparatus 10 is shown to include a charging source 11 having a resistive element 13 and a plurality of switches 15, each switch being positionable between a first, open position and a second, closed position in response to logic signals. The switches 15 are thereby controllable for sequentially connecting a first reference capacitor 17 of known value and a second capacitor 19 of unknown value to the resistive element 13 for charging the capacitors 17, 19 to a voltage potential. A voltage reference 21 having a predetermined input voltage generates a clocking pulse at the clock line 23 when the sequentially detected charge potential of each of the capacitors 17, 19 is equal to the predetermined trigger voltage established by the reference 21. A logic network 25 is included for generating the logic signals in response to the clocking pulse. A time-determining means 27 such as an exemplary oscilloscope or event (frequency) counter may be coupled to the logic network 25 for determining the first time required to charge the first capacitor 17 from an initially-depleted state to the predetermined potential of the reference 21. The oscilloscope may also be used for determining the second time required to charge the second capacitor 19 from an initially-depleted state to the predetermined potential. The first time, the second time and the value of the reference capacitor 17 may then be used to compute the value of the unknown capacitor 19 in accordance with disclosed formulas. In the alternative and in lieu of the oscilloscope, a filtering network 29 may be employed for filtering one of the logic signals to its average DC value which will be representative of the value of the unknown capacitor 19. Resistors 31 and 33 are connected in series with the first capacitor 17 and the second capacitor 19 respectively for limiting the resulting current during capacitor discharge. While the preferred embodiment of the circuit apparatus 10 is as shown in FIG. 4 wherein the switches 15 are embodied as a CMOS integrated chip and the comparators 35, 37, 39 and 41 are embodied as a single integrated chip, the operation of the circuit 10 will be more readily understood by reference to FIG. 1 where the switches 15 are represented as simple, two position devices of the conventional, mechanical type.

More particularly, the charging source 11 includes a source of input voltage 43 at a constant potential and a resistive element 13 coupled in series with the input voltage source 43. This source 43 will cause a charging current to flow to either the first capacitor 17 or the second capacitor 19, depending upon the position of the switches 15. In a preferred embodiment, the resistive element 13 is selected to have a resistance value several hundred times greater than that of either of the current limiting resistors 31, 33 and in the illustrated embodiment, a resistive ratio of 470:1 is used.

The voltage reference includes a connection 45 to the input voltage source 43 and a reference comparator 35 embodied as an AND gate for generating a clocking pulse at the clock line 23. A resistor 47 and capacitor 49 are included for providing a slight time delay upon initial startup in order to maintain the clock line 23 at logic "0" until all integrated circuit components have reached equilibrium. The comparator 35 senses the voltage value of the input voltage source 43 at its first terminal 51, the value of the charge voltage of either the first capacitor 17 or the second capacitor 19 at its second terminal 53 and generates a clock pulse whenever the value of a capacitor charge voltage rises to be equal to that of the trigger reference voltage. In the illustrated embodiment, this trigger reference voltage will be about one-half the voltage value of the input source 43.

The logic network 25 preferably includes a J-K flip-flop circuit 55 embodied as a CMOS integrated chip which is configured as a toggle flip-flop by coupling the J-K input terminals to the common source of input voltage 43. The flip-flop 55 includes a pulse input terminal 57, a first logic output terminal 59 and a second logic complement output terminal 61. These output terminals 59, 61 are coupled to a first logic gate 39 and a second logic gate 37 respectively. Since each of the input terminals of the logic gates 37, 39 are connected together, the logic states of the gate output terminals, 63 and 65 respectively, will each be identical to the logic state of their input terminals. The logic gates 37, 39 and their associated capacitors 67, 69 respectively provide a slight time delay to prevent, for example, the simultaneous closure of switches 1 and 2, an event which would corrupt the result of the capacitance measurement. The inclusion of these time delay devices is convenient since a readily available AND gate comparator integrated circuit includes four such comparators therewithin but resistors could be effectively substituted therefor. When constructed and arranged as shown, the flip-flop 55 and the logic gate outputs define a plurality of logic lines including the first, second, third and fourth logic lines 71, 73, 75, 77 respectively. It is to be appreciated that the instantaneous position of any switch is governed by the then-existing logic state of its associated logic line. For example, if logic line 71 is at logic "0", the switch labelled "1" will be in the open position as shown.

Before describing the operation of the circuit apparatus 10, several circuit characteristics and assumed initial conditions will be set forth. In the preferred embodiment, the internal resistive value of each of the switches 15 is on the order of 80 ohms. Further, the value of the resistive element 13 is selected to be substantially greater than the value of either of the current limiting resistors 31, 33 as described above and the value of either of the current limiting resistors 31, 33 is, in turn, substantially greater than the internal resistance of any switch. With respect to the initial conditions, the input voltage source 43 is assumed to be maintained at a constant voltage level, an exemplary 10 VDC, logic lines 71 and 77 are at logic "1", logic lines 73 and 75 are at logic "0", the first capacitor 17 is at a charge-depleted state of 0 VDC and the second capacitor 19 is charged to a voltage nominally equal to the trigger reference voltage of the reference comparator 35, 5 VDC for example.

Figure 2A:
FIGS. 2A–2H inclusive comprise graphical representations of voltage traces and logic signal states which appear at particular points of the circuit of FIG. 1.
Figure 2B:
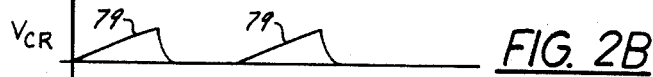
Figure 2C:
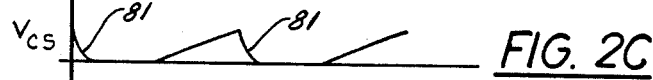

Given these initial conditions and at a first instant of time, arbitrarily designated time zero, the first capacitor 17 will commence exponential charging to the value of the input voltage source in accordance with a time constant represented by the formula $TC = C2(R1 + R2 + RS1)$ where RS1 is the resistive value of the switch "1". Simultaneously, the second capacitor 19 will commence discharging in accordance with a time constant represented by the formula $TD = C3(R3 + RS4)$ where RS4 is the resistive value of the switch "4". In view of the aforementioned resistive relationships, the charging time constant of the first capacitor 17 is determined almost entirely by the value of the resistive element 13(R1) in accordance with formula TC=C2(R1) while the discharge time constant of the second capacitor 19 is determined almost entirely by the value of the second current limiting resistor 33(R3) in accordance with the formula TD=C3(R3). Since the value of the second capacitor 19 is known to generally approximate that of the first capacitor 17 and since the value of the resistive element 13 is much greater than that of the second current limiting resistor 33, the time required to charge the first capacitor 17 is much greater than that required to discharge the second capacitor 19 as is illustrated in FIGS. 2B and 2C where the charging curve 79 for the first capacitor 17 is plotted against the discharging curve 81 of the second capacitor 19 immediately subsequent to the aforementioned initial conditions.

Figure 2D:

The first capacitor 17(C2) continues charging until the voltage at the second input terminal 53 is equal to the trigger reference voltage whereupon the comparator gate 35 generates a logic "1" signal in the form of a rising edge 83 of a clocking pulse as shown in FIG. 2D. The time T1 required for the first capacitor 17 to attain a charge equal to the trigger reference voltage is closely approximated by the formula $T1 = -C2(R1) \ln(\frac{1}{2})$. Upon the occurrence of the rising edge 83 of the clocking pulse, the logic states of the first output terminal 59 and the second output terminal 61 are caused to toggle, the logic state of the first output terminal 59 changing from logic "0" to logic "1" and that of the second output terminal 61 changing from logic "1" to logic "0". Upon toggling, the switches "1" and "3" are closed and the switches "2" and "4" are opened whereupon the first capacitor 17 commences discharging as shown in the decaying portion of the curve of FIG. 2B. This is so, notwithstanding the fact that the first capacitor 17 is still connected to the resistive element 13 since that element 13 has a value very much greater than that of the first current limiting resistor 31. Upon toggling, the second capacitor 19 is maintained in a charged-depleted state. Nearly instantaneously, the voltage at the second input terminal 53 falls below the trigger reference level and the output terminal or clocking line 23 of the gate 35 will go to logic "0" as represented by the falling edge 85 of FIG. 2D. It is to be appreciated that the apparent time to discharge the second capacitor 19 as shown in the decaying portion of the curve of FIG. 2C and the time width of the clocking pulse as represented in FIG. 2D have been greatly exaggerated for purposes of explanation.

Since the flip-flop 55 has been configured to toggle only upon a rising edge 83 of a clocking pulse, the only change occasioned by the discharge of the first capacitor 17 below the trigger reference level is that the state of clock line 23 is changed to logic "0". The states of logic lines 71, 73 change from logic "1" to logic "0" and from logic "0" to logic "1" respectively after a brief time delay caused by the charging of two gate capacitors 67, 69, one of which is coupled to each logic gate 37, 39. With the described changes of state of logic lines 71, 73, 75 and 77, switches "1" and "4" are open and switches "2" and "3" are closed, these positions being the complement of the initial, assumed condition. Thereupon, the second capacitor 19(C3) commences charging in accordance with a charging time T2 closely approximated by the formula $T2 = -R1(C3) \ln(\frac{1}{2})$. The cycle then repeats.

Figure 2E:
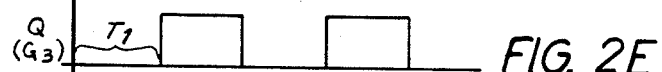
Figure 2F:
Figure 2G:
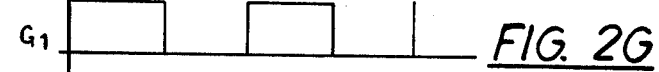
Figure 2H:
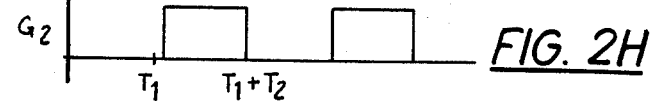

Referring to FIGS. 2E and 2F, the respective logic states of the first logic terminal 59 and the second logic terminal 61 are graphically represented while FIGS. 2G and 2H graphically represent the logic states of logic lines 71 and 73, respectively. An examination of the timing diagram of FIG. 2E illustrates that when the value of the second capacitor 19 is equal to that of the first capacitor 17, the signal at the first logic terminal 59 has a 50% duty cycle D, i.e., is at logic "0" and logic "1" states for equivalent time periods; T1=T2. When the value of the second capacitor 19 is unequal to that of the first capacitor 17, the duty cycle D may be computed using the formula D=T2 divided by (T1+T2). Thereupon, the value of the unknown, second capacitor 19 may be computed using an oscilloscope or similar device to measure time.

In the alternative and in lieu of using an oscilloscope, the logic signal may be converted to its average DC value by passing it through a buffer comparator 41 and a filter comprised of a resistor 87 and a capacitor 89. The average DC value may then be measured across the output terminals. Those skilled in the art will appreciate that the value of the capacitor C2 may also be determined by frequency measurements made at the output terminals, employing a frequency counter or a microprocessor. One may also couple a counter to the clock line for counting alternate pulses. If average DC output is used for capacitance measurement, the value of the second capacitor 19 may be computed in accordance with the formula C3 equals (C2)(VAO) divided by (VI-VAO) where VAO is the average DC output voltage and VI is the value of the potential of the input source 43. On the other hand, if frequency is desired to be used for capacitance measurement, the value of the second capacitor 19 may be computed in accordance with the formula $$C3 \text{ equals} - \left[ C2 + \frac{1}{fR1 \ln\left(1 - \frac{VTR}{VI}\right)} \right]$$

where f is frequency in Hertz and VTR is the value of the trigger reference voltage. Capacitances are in picofarads, voltages are in volts and resistance is in ohms.

Figure 3:
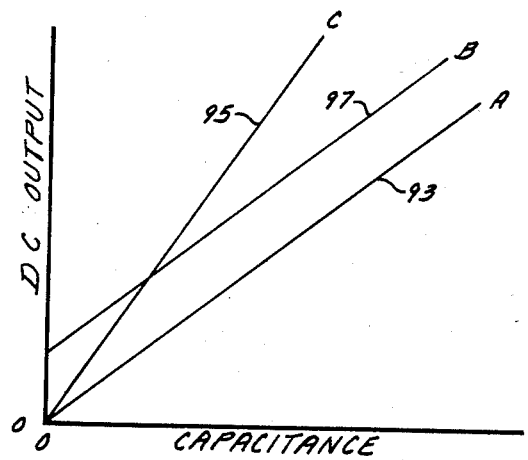
FIG. 3 is a simplified graph representing the error-generating effect of changes in ambient temperature upon capacitance measurement.

Referring to FIG. 3, there is shown a typical operating line 93 for the apparatus 10 and method of the invention. An error in gain caused by changes in ambient temperature and resulting temperature coefficient mismatches would be represented by line 95 while a zero error would be represented by curve 97. Assuming that the full scale range of the capacitor 19 is on the order of 50-180 picofarad and further assuming a shift in the temperature of the ambient surrounding the apparatus 10 of 100 degrees F., it has been found that the inventive apparatus 10 and method results in a substantial improvement in measurement accuracy over that available with the measurement apparatus of the aforementioned Technical Information 063. For example and with respect to errors due to changes in resistance over the described temperature shift, the apparatus of the Information yielded about plus or minus 5% zero error and plus or minus 1% gain error. In contrast, the inventive apparatus 10 yielded less than 1% and less than 0.1% zero and gain error respectively. Similarly, the resulting change in the level of the input voltage source 43 was about plus or minus 3% zero error and plus or minus 0.6% gain error for the apparatus of the Information and nominally 0% zero and gain error for the inventive apparatus 10.

The following component values have been found useful in the present invention where resistance is in ohms, tolerance 1%; capacitance is in microfarads, tolerance 20%, all unless otherwise indicated.

| FIGS. 1,4 | | | |
|---|---|---|---|
| R1 | 470K | R2, R3 | 1K |
| R4 | 560K, 5% | R5 | 100K |
| C1 | 0.1 | C3 | 150 pf matched |
| C4, C5 | 0.001 | | to temp. coeff. of C2 |
| U1 | 4066 | C6 | 0.01 |
| U3–U6 | 4081 | U2 | 4027 |

While only a single preferred embodiment of the inventive circuit apparatus 10 and method for determining capacitance value have been shown and described, the invention is not intended to be limited thereby but only by the claims which follow.

I claim:

1. An electrical circuit useful in determining the value of a capacitor including:
   a first bilateral switch for flowing a charging current through a resistive element to an initially-depleted first capacitor of known value, thereby charging said first capacitor to the potential of a voltage reference over a resulting first time;
   a second bilateral switch for flowing a charging current through said resistive element to an initially depleted second capacitor, thereby charging said second capacitor to said potential over a resulting second time, and;
   means for determining said times.

2. The invention set forth in claim 1 wherein said voltage reference includes a reference comparator for establishing a trigger reference voltage, first comparator input terminal for sensing a voltage source at a potential, a second input terminal for sequentially sensing the charge potential of said capacitors and means for generating a clocking pulse when said charge potential is equal to said trigger reference voltage.

3. The invention set forth in claim 2 further including a logic network for generating logic signals in response to said clocking pulse, said bilateral switches being positionably responsive to said logic signals.

4. A circuit useful in determining the value of a capacitor and including:
   a charging source including a resistive element;
   a plurality of switches, each switch being positionable between a first, open position and a second, closed position in response to logic signals, said switches thereby being controllable for sequentially connecting a first reference capacitor of known value and a second capacitor to said resistive element for charging said capacitors to a potential;
   a voltage reference for establishing a trigger reference voltage and generating a clocking pulse when the sequentially detected charge potential of said capacitors is equal to said trigger reference voltage;
   a logic network for generating said logic signals in response to said clocking pulse, and;
   means for determining a first time required to charge said first capacitor from an initially-depleted state to said trigger reference voltage and for determining a second time required to charge said second capacitor from an initially-depleted state to said trigger reference voltage.

5. The invention set forth in claim 4 wherein said clocking pulse includes a rising edge, said plurality of switches includes two pair of switches, one of said pair being repositioned upon the occurrence of said rising edge, the other of said pair being repositioned at a time subsequent to the occurrence of said rising edge.

6. A method for determining the value of a capacitor including the steps of:
   flowing a charging current through a resistive element to an initially-depleted first capacitor of known value for charging said first capacitor to the potential of a voltage reference over a resulting first time;
   flowing a charging current through said resistive element to an initially-depleted second capacitor for charging said second capacitor to said potential of said voltage reference over a resulting second time, and;
   computing the value of said second capacitor by utilizing said first time, said second time and the value of said first capacitor.

7. The method set forth in claim 6 wherein said voltage reference includes a reference comparator for establishing a trigger reference voltage, a first comparator input terminal for sensing a voltage source at a known potential, a second comparator input terminal for sequentially sensing the charge potential of said capacitors and means for generating an output signal when said charge potential is equal to said trigger reference voltage.

8. The method set forth in claim 7 wherein said computing step includes a calculation of duty cycle by dividing said first time by the sum of said first time and said second time.

9. A method for determining the value of a capacitor including the steps of:
   providing a source of charging voltage having a resistive element coupled in series therewith;
   connecting an initially-depleted reference capacitor to said resistive element at a first time for charging said reference capacitor to a reference voltage;
   generating a first clocking pulse when said reference capacitor is charged to said reference voltage;
   connecting an initially-depleted second capacitor to said resistive element at a second time for charging said second capacitor to said reference voltage;
   generating a second clocking pulse when said second capacitor is charged to said reference voltage;
   measuring the elapsed times between said first time and said first clocking pulse and between said first clocking pulse and said second clocking pulse; and;
   computing a duty cycle utilizing said elapsed times.

10. The method set forth in claim 9 wherein the sequential connection of said capacitors to said resistive element is by a plurality of controllable positionable switches.

11. The method set forth in claim 10 wherein said clocking pulses each include a rising edge and a falling edge and said rising edges are utilized for said measuring of the elapsed times.

12. The method set forth in claim 9 wherein said connections are made in response to a clocking pulse.

13. The method set forth in claim 11 wherein said connections are made in response to a rising edge of a clocking pulse.

14. A method for determining the value of a capacitor including the steps of:

providing a first, charge-depleted reference capacitor of known value and a second capacitor of unknown value;

providing a charging source including a resistive element for sequentially charging said capacitors to the potential of a voltage reference;

providing a voltage reference having a predetermined trigger reference voltage for generating a clocking pulse when the charge potential of one of said capacitors is equal to said trigger reference voltage, said clocking pulse having a rising edge;

providing a logic network for generating logic signals in response to said clocking pulse;

providing a plurality of bilateral switches, each of which is responsively positionable by a logic signal;

closing a first bilateral switch for connecting said reference capacitor to said resistive element at a first time and substantially simultaneously closing a fourth bilateral switch for connecting said second capacitor to a point of ground potential;

generating a first clocking pulse when the charge potential of said reference capacitor is equal to said trigger reference voltage;

determining the elapsed time T1 between said first time and the rising edge of said first clocking pulse;

generating first logic signals in response to said rising edge of said first clocking pulse;

closing a third bilateral switch for connecting said reference capacitor to said point of ground potential and substantially simultaneously opening said fourth bilateral switch, both in response to said first logic signals;

opening said first bilateral switch and substantially simultaneously closing a second bilateral switch, both in response to said first logic signals, said closure of said second switch thereby connecting said second capacitor to said resistive element;

generating a second clocking pulse when the charge potential of said second capacitor is equal to said trigger reference voltage;

determining the elapsed time T2 between said rising edge of said first clocking pulse and the rising edge of said second clocking pulse;

computing a duty cycle D in accordance with the formula $D = T2$ divided by $(T1 + T2)$, and;

computing the value of said second capacitor in accordance with the formula $C3 = (D)(C2)$ divided by $(1 - D)$.

* * * * *

UNITED STATES PATENT OFFICE
CERTIFICATE OF CORRECTION

PATENT NO. : 4,558,274
DATED : December 10, 1985
INVENTOR(S) : Carusillo, Steven J.

It is certified that error appears in the above-identified patent and that said Letters Patent are hereby corrected as shown below:

Title:  --FOR-- should be inserted between "METHOD" and "DETERMINING"

Column 2, line 25 "accompaning" should be --accompanying--

Column 6, line 51 "50-180" should be --150-180--

Signed and Sealed this

Thirteenth Day of May 1986

[SEAL]

Attest:

DONALD J. QUIGG

Attesting Officer

Commissioner of Patents and Trademarks